(12) United States Patent
Liu

(10) Patent No.: US 12,175,042 B2
(45) Date of Patent: Dec. 24, 2024

(54) DISPLAY MODULE

(71) Applicant: Wuhan China Star Optoelectronics Technology Co., Ltd., Hubei (CN)

(72) Inventor: Guangkun Liu, Hubei (CN)

(73) Assignee: Wuhan China Star Optoelectronics Technology Co., Ltd., Wuhan (CN)

( * ) Notice: Subject to any disclaimer, the term of this patent is extended or adjusted under 35 U.S.C. 154(b) by 0 days.

(21) Appl. No.: 17/439,424

(22) PCT Filed: Jul. 21, 2021

(86) PCT No.: PCT/CN2021/107691
§ 371 (c)(1),
(2) Date: Sep. 15, 2021

(87) PCT Pub. No.: WO2022/267141
PCT Pub. Date: Dec. 29, 2022

(65) Prior Publication Data
US 2024/0028163 A1    Jan. 25, 2024

(30) Foreign Application Priority Data

Jun. 22, 2021 (CN) .......................... 202110693417.0

(51) Int. Cl.
*G06F 3/042* (2006.01)
*G02F 1/1333* (2006.01)
(Continued)

(52) U.S. Cl.
CPC ........ *G06F 3/0421* (2013.01); *G02F 1/13338* (2013.01); *G02F 1/133553* (2013.01);
(Continued)

(58) Field of Classification Search
CPC ...... G06F 3/0421; G06F 3/0412; G06F 3/041; G06F 3/042; G02F 1/13338;
(Continued)

(56) References Cited

U.S. PATENT DOCUMENTS

2012/0032920 A1    2/2012  Chien et al.
2019/0138154 A1*   5/2019  Smith ..................... B32B 7/023

FOREIGN PATENT DOCUMENTS

CN        103336605       10/2013
CN        206058222       3/2017
(Continued)

OTHER PUBLICATIONS

International Search Report and the Written Opinion Dated Feb. 28, 2022 From the International Searching Authority Re. Application No. PCT/CN2021/107691 and Its Translation Into English. (15 Pages).
(Continued)

*Primary Examiner* — Adam R. Giesy

(57) ABSTRACT

A display module is provided. The display module includes a cover plate and a reflection layer. A touch light source is disposed in an edge region of the display module. A first grating is disposed on a side of the cover plate facing toward the touch light source. The first grating is obliquely disposed to the cover plate. After light emitted from the touch light source passes through the first grating, the light enters into the cover plate and is total reflection. Obtaining information of a to-be-recognized terminal from an entire surface of the display module can be realized after the total reflection is destroyed when the to-be-recognized terminal touches a surface of the cover plate.

19 Claims, 2 Drawing Sheets

(51) Int. Cl.
  *G02F 1/1335* (2006.01)
  *G06F 3/041* (2006.01)
  *G06V 40/13* (2022.01)
  *H01L 27/146* (2006.01)

(52) U.S. Cl.
  CPC ........ *G06F 3/0412* (2013.01); *G06V 40/1318* (2022.01); *G06V 40/1324* (2022.01); *G06V 40/13* (2022.01); *H01L 27/14678* (2013.01)

(58) Field of Classification Search
  CPC .... G02F 1/133553; G02F 1/13; G02F 1/1333; G02F 1/1335
  See application file for complete search history.

(56) References Cited

FOREIGN PATENT DOCUMENTS

| CN | 106940598 | 7/2017 |
|---|---|---|
| CN | 107527039 | 12/2017 |
| CN | 107621673 | 1/2018 |
| CN | 108269500 | 7/2018 |
| CN | 208521261 | 2/2019 |
| CN | 209859155 | 12/2019 |
| CN | 110991409 | 4/2020 |
| CN | 111208665 | 5/2020 |
| CN | 111242039 | 6/2020 |
| CN | 210895487 | 6/2020 |
| CN | 111597912 | 8/2020 |
| CN | 211319241 | 8/2020 |
| CN | 112230474 | 1/2021 |
| CN | 112334909 | 2/2021 |
| CN | 112740153 | 4/2021 |
| CN | 112099259 | 1/2022 |

OTHER PUBLICATIONS

Notification of Decision of Rejection Dated Apr. 23, 2023 From The State Intellectual Property Office of the People's Republic of China Re. Application No. 202110693417.0 and Its Translation Into English. (15 Pages).

Notification of Office Action and Search Report Dated Jul. 1, 2022 From The State Intellectual Property Office of the People's Republic of China Re. Application No. 202110693417.0 and Its Translation Into English. (16 Pages).

Notification of Office Action and Search Report Dated Mar. 4, 2022 From The State Intellectual Property Office of the People's Republic of China Re. Application No. 202110693417.0 and Its Translation Into English. (13 Pages).

Notification of Office Action and Search Report Dated Sep. 13, 2022 From The State Intellectual Property Office of the People's Republic of China Re. Application No. 202110693417.0 and Its Translation Into English. (24 Pages).

* cited by examiner

DISPLAY MODULE

RELATED APPLICATIONS

This application is a National Phase of PCT Patent Application No. PCT/CN2021/107691 having International filing date of Jul. 21, 2021, which claims the benefit of priority of Chinese Patent Application No. 202110693417.0 filed on Jun. 22, 2021. The contents of the above applications are all incorporated by reference as if fully set forth herein in their entirety.

FIELD AND BACKGROUND OF THE INVENTION

The present application relates to a field of touch display technology, and specifically to a display module.

Fingerprint recognition has been widely used as an identity recognition method for mobile electronic devices, and in the identity recognition method, a single-point fingerprint recognition method is adopted. A mainstream fingerprint recognition technology is a capacitive type and an optical type. The capacitive type is basically used in liquid crystal display modules and is usually located on back surfaces, lower edges, or lateral surfaces of mobile phones. This method not only detracts from appearance of devices, but as screen-to-body ratios continue being increased, capacitive fingerprint recognition modules can no longer be placed. The optical type is basically used in organic light-emitting diode display devices, and recognition regions are located in display regions, which have good appearance. Although aforesaid two schemes have been widely used, the fingerprint recognition can only be fixed in a specific small region, which lacks convenience in operation. In order to improve the level of product market competition, developing an optical large-area fingerprint recognition technology is intensively required.

Therefore, current display modules have a technical problem of impossibility of large-area fingerprint recognition.

SUMMARY OF THE INVENTION

Embodiments of the present application provide a display module, which can remedy a technical problem of impossibility of large-area fingerprint recognition existing in current display modules.

One embodiment of the present application provides a display module, including
 a touch light source;
 a display panel;
 a cover plate, wherein the cover plate is disposed on a side of the display panel away from the backlight module, and a reflection layer is disposed on a lateral surface of the cover plate facing toward the display panel; and
 a recognition component, wherein the recognition component is disposed on a side of the display panel facing away from the cover plate and is configured to receive reflected light after a to-be-recognized terminal pressing a surface of the cover plate, and
 wherein, the display module includes a central region and an edge region disposed enclosing the central region, the touch light source is disposed in the edge region, and a first grating is disposed on a side of the cover plate facing toward the touch light source, the first grating is obliquely disposed to the cover plate, after light emitted from the touch light source passes through the first grating, the light enters into the cover plate to form refracted light, and total reflection of the refracted light occurs in the cover plate.

Optionally, in some embodiments of the present application, a refractive index of the cover plate is n1, a refractive index of the reflection layer is n2, and a refractive index of the to-be-recognized terminal is n3, when the to-be-recognized terminal presses any location on the cover plate, the to-be-recognized terminal destroys total reflection of light in the cover plate, an angle α of the refracted light satisfy: arcsin (n2/n1)≤α<arcsin (n3/n1).

Optionally, in some embodiments of the present application, n3 is greater than n2, and n3 is greater than n1.

Optionally, in some embodiments of the present application, the refractive index of the reflection layer is less than the refractive index of the cover plate.

Optionally, in some embodiments of the present application, the reflection layer is in a phase of any one of solid, gas, or liquid.

Optionally, in some embodiments of the present application, the touch light source is disposed in the edge region, and the touch light source is disposed aligned to the cover plate in the edge region.

Optionally, in some embodiments of the present application, a first collimation component is disposed on a side of the touch light source facing toward the cover plate, and the first collimation component is configured to converge light emitted from the touch light source.

Optionally, in some embodiments of the present application, the first collimation component is composed of at least one of a collimation grating or a prism structure.

Optionally, in some embodiments of the present application, the prism structure is a convex lens or a concave lens.

Optionally, in some embodiments of the present application, when the refractive index of the cover plate is 1.5, a light emission angle of the first collimation component is less than 42 degrees.

Optionally, in some embodiments of the present application, a refractive index of a manufacturing material of the first collimation component is greater than 1.6.

Optionally, in some embodiments of the present application, in the edge region, a light shielding layer is disposed on a lateral surface of the cover plate facing toward the touch light source, and the first grating is disposed on a lateral surface of the light shielding layer facing away from the cover plate.

Optionally, in some embodiments of the present application, the touch light source is a mini light emitting diode (mini-LED) light plate or a micro light emitting diode (micro-LED) light plate.

Optionally, in some embodiments of the present application, a width of a light plate of the touch light source is less than or equal to 0.6 millimeter.

Optionally, in some embodiments of the present application, the touch light source is an infrared light source.

Optionally, in some embodiments of the present application, a manufacturing material of the light shielding layer is black ink which enables infrared to penetrate.

Optionally, in some embodiments of the present application, a second collimation component is disposed on a side of the recognition component facing toward the cover plate.

Optionally, in some embodiments of the present application, the to-be-recognized terminal is a finger, and the recognition component is a fingerprint sensor.

Optionally, in some embodiments of the present application, the to-be-recognized terminal is a stylus pen.

Optionally, in some embodiments of the present application, the first collimation component is a first prism structure or a second grating, the second collimation component is a second prism structure or a third grating, and the first prism structure, the second prism structure, the second grating, and the third grating are configured to converge light.

The display module provided by the embodiments of the present application includes the touch light source, the display panel, the cover plate, and the recognition component. The cover plate is disposed on a side of the display panel away from the backlight module. The reflection layer is disposed on a lateral surface of the cover plate facing toward the display panel. The recognition component is disposed on a side of the display panel facing away from the cover plate and is configured to receive reflected light after a to-be-recognized terminal pressing a surface of the cover plate. Wherein, the display module includes a central region and an edge region disposed enclosing the central region, the touch light source is disposed in the edge region, and a first grating is disposed on a side of the cover plate facing toward the touch light source, the first grating is obliquely disposed to the cover plate, after light emitted from the touch light source passes through the first grating, the light enters into the cover plate to form refracted light, and total reflection of the refracted light occurs in the cover plate. By disposing the first grating on the lateral surface of the cover plate facing toward the touch light source, the light entering the cover plate is total reflection. The light continues to propagate in the cover plate until the to-be-recognized terminal contacts the surface of the cover plate, and then the total reflection is destroyed. The light is reflected by the to-be-recognized terminal to the identification component, which realizes obtaining information of the to-be-recognized terminal from an entire surface of the display module.

BRIEF DESCRIPTION OF THE SEVERAL VIEWS OF THE DRAWINGS

To more clearly illustrate embodiments or the technical solutions of the present disclosure, the accompanying figures of the present disclosure required for illustrating embodiments or the technical solutions of the present disclosure will be described in brief. Obviously, the accompanying figures described below are only part of the embodiments of the present disclosure, from which figures those skilled in the art can derive further figures without making any inventive efforts.

DESCRIPTION OF SPECIFIC EMBODIMENTS OF THE INVENTION

Figure 1:
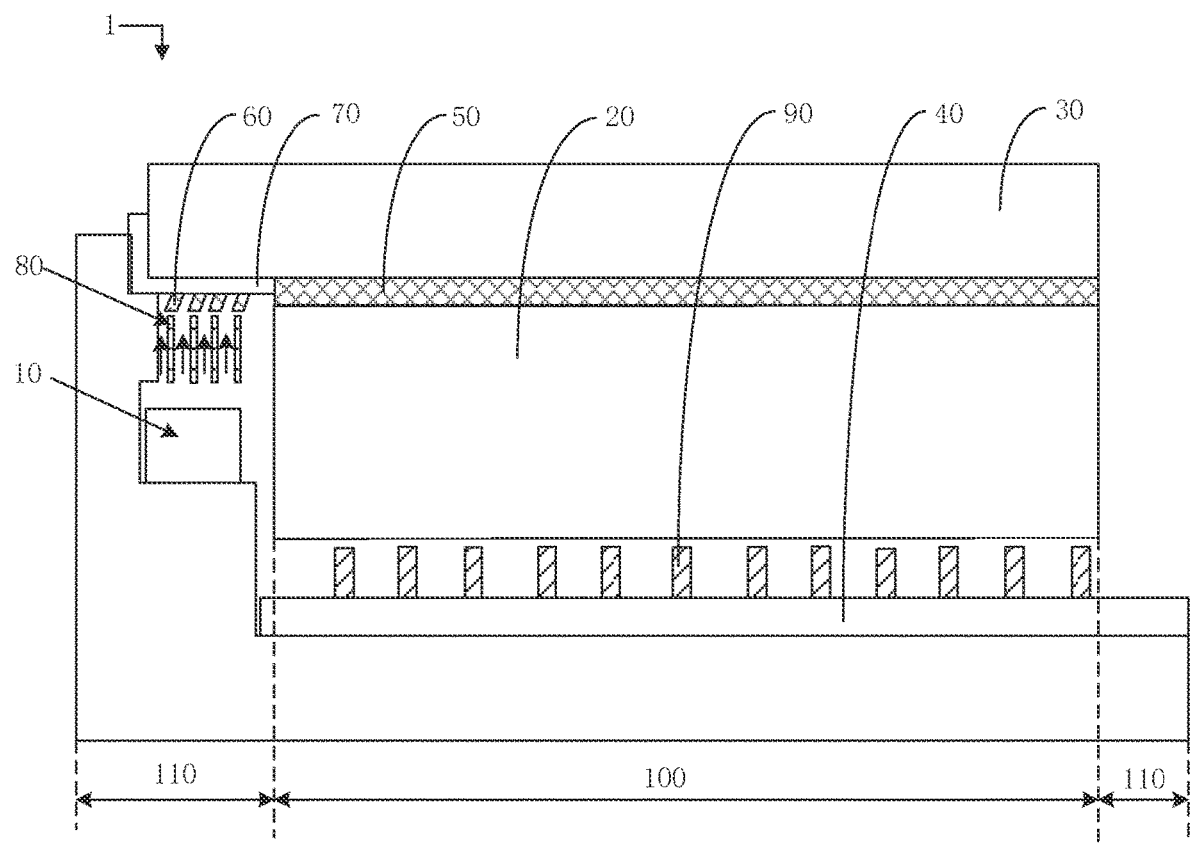
FIG. 1 is a sectional schematic diagram of a display module provided by one embodiment of the present application.

The technical solutions in the embodiments of the present disclosure are clearly and completely described in the following with reference to the accompanying drawings in the embodiments of the present disclosure. Obviously, the described embodiments are only part of the embodiments of the present disclosure, and are not all embodiments of the present disclosure. All other embodiments obtained by those skilled in the art based on the embodiments of the present disclosure without creative efforts are within the scope of the present disclosure. Besides, it should be understood that the specific embodiments described herein are merely for describing and explaining the present application and are not intended to limit the present application. In the present disclosure, unless opposite stated, the orientation words used such as "upper" and "lower" generally refer to the upper and lower directions of the device in actual using or working state, and specifically refer to the drawing directions in the drawings, and "inner" and "outer" refer to the outline of the device.

Embodiments of the present application provides a display module, and details are described below respectively. It should be noted that a description order of following embodiments is not intended to limit a preferred order of the embodiments.

As illustrated in FIG. 1, the display module 1 provided by the embodiments of the present application includes a touch light source 10, a display panel 20, a cover plate 30, and a recognition component 40. The cover plate 30 is disposed on a side of the display panel 20 away from a backlight module. A reflection layer 50 is disposed on a lateral surface of the cover plate 30 facing toward the display panel 20. The recognition component 40 is disposed on a side of the display panel 20 facing away from the cover plate 30 and is configured to receive reflected light after a to-be-recognized terminal pressing a surface of the cover plate 30. Wherein, the display module 1 includes a central region 100 and an edge region 110 disposed enclosing the central region 100, the touch light source 10 is disposed in the edge region 110, and a first grating 60 is disposed on a side of the cover plate 30 facing toward the touch light source 10. The first grating 60 is obliquely disposed on the cover plate 30. After light emitted from the touch light source 10 passes through the first grating 60, the light enters into the cover plate 30 to form refracted light, and total reflection of the refracted light occurs in the cover plate 30.

In this embodiment, by disposing the first grating 60 on the lateral surface of the cover plate 30 facing toward the touch light source 10, the light entering the cover plate 30 is total reflection. The light continues to propagate in the cover plate 30 until the to-be-recognized terminal contacts the surface of the cover plate 30, and then total reflection is destroyed. The light is reflected by the to-be-recognized terminal to the recognition component 40, which realizes obtaining information of the to-be-recognized terminal from an entire surface of the display module 1.

Wherein, the first grating 60 is configured to incident light emitted by the touch light source 10 to the cover plate 30 at a specific angle, and total reflection of the light occurs in the cover plate 30.

Wherein, the reflection layer 50 is configured to allow total reflection of the light occurs in the cover plate 30.

In one embodiment, the reflection layer 50 can be obtained and manufactured by any material with a lower refractive index than the cover plate 30.

In this embodiment, the reflection layer 50 is in a phase such as solid, gas, or liquid, etc., which is configured to keep the total reflection of the light in the cover plate 30. The reflection layer can maintain the light incident in the cover plate at a certain angle to be total reflection by the reflection layer, and the totally reflected light cannot pass through a side of the reflection layer.

In one embodiment, a refractive index of the cover plate 30 is n1, a refractive index of the reflection layer 50 is n2, and a refractive index of the to-be-recognized terminal is n3. When the to-be-recognized terminal presses any location on the cover plate 30, the to-be-recognized terminal can destroy total reflection of light in the cover plate 30. An angle α of the refracted light satisfy:

$$\arcsin\left(\frac{n2}{n1}\right) \le \alpha < \arcsin\left(\frac{n3}{n1}\right).$$

Wherein, the to-be-recognized terminal can be a finger.

Wherein, the to-be-recognized terminal can also be a stylus pen.

Wherein, n3 is greater than n2, and n3 is greater than n1.

Wherein, n2 can be equal to n1.

In this embodiment, the refractive index of the to-be-recognized terminal needs to be greater than the refractive index of the reflection layer 50, so that the total reflection of the light can be maintained in the cover plate 30.

In one embodiment, the touch light source 10 is disposed in the edge region 110, and the touch light source 10 is disposed aligned with the cover plate 30 in the edge region 110.

Wherein, the touch light source 10 is an infrared light source.

In one embodiment, a first collimation component 80 is disposed on a side of the touch light source 10 facing toward the cover plate 30, and the first collimation component 80 is configured to converge the light emitted from the touch light source 10.

Wherein, the first collimation component 80 is composed of at least one of a collimation grating or a prism structure.

Wherein, the prism structure can be a convex lens.

Wherein, the prism structure can also be a concave lens.

In this embodiment, a light emission angle of the touch light source 10 is converged to a certain range by the first collimation component 80, so that the light of the touch light source 10 cannot be totally reflected to the recognition component 40, causing interference.

In one embodiment, when the refractive index of the cover plate 30 is 1.5, a light emission angle of the first collimation component 80 is less than 42 degrees.

Wherein, when the refractive index of the cover plate 30 is 1.5, a critical total reflection angle of the cover plate 30 to air is 42 degrees.

In this embodiment, a light emission angle of light passing through the first collimation component 80 is restricted within 42 degrees, so that the light of the touch light source 10 cannot be totally reflected to the recognition component 40, preventing the recognition component 40 from interference of the total reflection light of the touch light source 10.

In one embodiment, a refractive index of a manufacturing material of the first collimation component 80 is greater than 1.6.

In one embodiment, in the edge region 110, a light shielding layer 70 is disposed on the lateral surface of the cover plate 30 facing toward the touch light source 10, and the first grating 60 is disposed on a lateral surface of the light shielding layer 70 facing away from the cover plate 30.

Wherein, the light shielding layer 70 is disposed in the edge region 110.

Wherein, the light shielding layer 70 is disposed corresponded to the touch light source 10.

In this embodiment, the light shielding layer 70 is configured to shield environmental light from entering the display module 1 and affecting the touch light source 10 and the recognition component 40, etc.

In one embodiment, a manufacturing material of the light shielding layer 70 is black ink which enables infrared light to penetrate.

Wherein, the light shielding layer 70 only shield the environmental light, but infrared light of the touch light source 10 can penetrate.

In this embodiment, while the light shielding layer 70 shields the environmental light, it does not affect the light of the touch light source 10 to enter the cover plate 30, thereby preventing an abnormal phenomenon of touch display.

In one embodiment, a second collimation component 90 is disposed on a side of the recognition component 40 facing toward the cover plate 30.

Wherein, the second collimation component 90 is configured to converge the reflected light reflected from the to-be-recognized terminal.

In one embodiment, the to-be-recognized terminal is a finger, and the recognition component 40 is a fingerprint sensor.

Wherein, when the finger presses any location, the finger is equivalent to one light source. The finger includes ridges and valleys. There is no gap with air between the ridges and the cover plate 30, so more light can enter the fingerprint sensor. However, there are gaps with air between the valleys and the cover plate 30, so light entering the fingerprint sensor is weak, forming biological characteristic information that the ridges are brighter and the valleys are darker. The infrared light carrying fingerprint information enters an interior of a lower part of a screen, and then reaches the fingerprint sensor through a second collimated light path.

In this embodiment, by disposing the second collimation component, light received by the recognition component can be more converged, improving an information receiving effect of the recognition component.

In one embodiment, the first collimation component 80 is a first prism structure or a second grating, and the second collimation component 90 is a second prism structure or a third grating. The first prism structure, the second prism structure, the second grating, and the third grating are configured to converge light.

In one embodiment, the display panel 20 is a liquid crystal display panel 20.

Wherein, the liquid crystal display panel 20 can be penetrated by the infrared light.

Wherein, the display module 1 further includes a reflective sheet, a diffusion sheet, and a luminance-enhancing film.

Wherein, the display module 1 further includes a backlight module.

In one embodiment, the display panel 20 is an organic light-emitting diode (OLED) display panel 20.

Wherein, because a backlight module does not need to be disposed in the OLED display panel 20, the display module 1 can be penetrated by infrared light.

In one embodiment, the touch light source 10 is an infrared light source, the touch light source 10 is a mini light emitting diode (mini-LED) light plate or a micro light emitting diode (micro-LED) light plate, and a width of a light plate of the touch light source 10 does not exceed 0.6 millimeter.

In this embodiment, by restricting a width of the touch light source 10, narrow bezel display can be realized.

Figure 2:
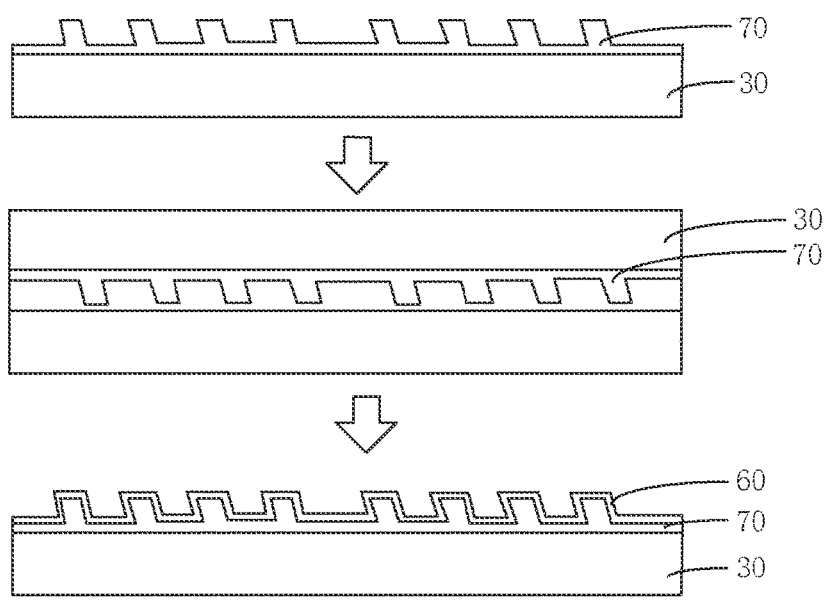
FIG. 2 is a film-layer schematic diagram of a manufacturing method of a first grating provided by one embodiment of the present application.
Figure 3:
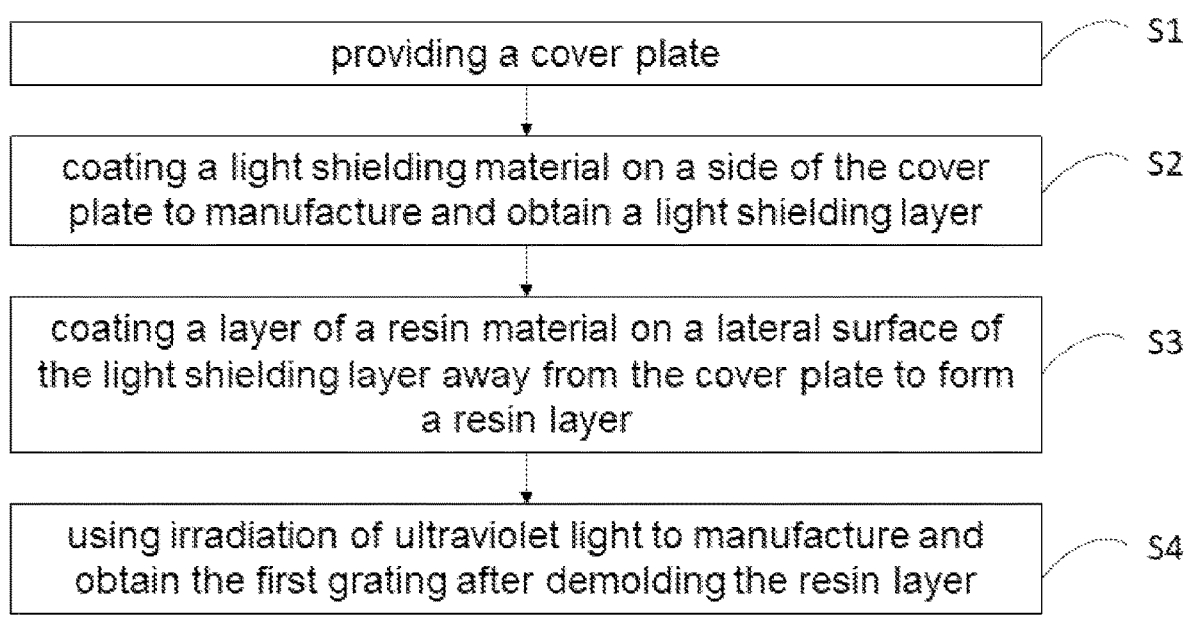
FIG. 3 is a flowchart of the manufacturing method of the first grating provided by one embodiment of the present application.

As illustrated in FIG. 2 and FIG. 3, a manufacturing method of the first grating provided by the present application includes:

S1: providing a cover plate;

S2: coating a light shielding material on a side of the cover plate to manufacture and obtain a light shielding layer;

S3: coating a layer of a resin material on a lateral surface of the light shielding layer away from the cover plate to form a resin layer; and S4: using irradiation of ultraviolet light to manufacture and obtain the first grating after demolding the resin layer.

The display module provided by this embodiment includes the touch light source, the display panel, the cover plate, and the recognition component. The cover plate is disposed on a side of the display panel away from the backlight module. The reflection layer is disposed on a lateral surface of the cover plate facing toward the display panel. The recognition component is disposed on a side of the display panel facing away from the cover plate and is configured to receive a reflected light after a to-be-recognized terminal pressing a surface of the cover plate. Wherein, the display module includes a central region and an edge region disposed enclosing the central region, the touch light source is disposed in the edge region, and a first grating is disposed on a side of the cover plate facing toward the touch light source, the first grating is obliquely disposed to the cover plate, after light emitted from the touch light source passes through the first grating, the light enters into the cover plate to form a refracted light, and total reflection of the refracted light occurs in the cover plate. By disposing the first grating on the lateral surface of the cover plate facing toward the touch light source, the light entering the cover plate is total reflection. The light continues to propagate in the cover plate until the to-be-recognized terminal contacts the surface of the cover plate, and then the total reflection is destroyed. The light is reflected by the to-be-recognized terminal to the recognition component, which realizes obtaining information of the to-be-recognized terminal from an entire surface of the display module.

The above describes a display module of the embodiments of the present application in detail. This article uses specific cases for describing the principles and the embodiments of the present application, and the description of the embodiments mentioned above is only for helping to understand the method and the core idea of the present application. Meanwhile, for those skilled in the art, will have various changes in specific embodiments and application scopes according to the idea of the present application. In summary, the content of the specification should not be understood as limit to the present application.

What is claimed is:

1. A display module, comprising:
a touch light source;
a display panel;
a backlight module;
a cover plate, wherein the cover plate is disposed on a side of the display panel-away from the backlight module, and a reflection layer is disposed on a lateral surface of the cover plate facing toward the display panel; and
a recognition component;
wherein the recognition component is disposed on a side of the display panel facing away from the cover plate and is configured to receive reflected light after a to-be-recognized terminal presses a surface of the cover plate,
wherein the display module comprises a central region and an edge region disposed enclosing the central region, the touch light source is disposed in the edge region, a first grating is disposed on a side of the cover plate facing toward the touch light source, the first grating is obliquely disposed to the cover plate, after light emitted from the touch light source passes through the first grating, the light enters into the cover plate to form refracted light, and total reflection of the refracted light occurs in the cover plate;
a refractive index of the cover plate is n1, a refractive index of the reflection layer is n2, and a refractive index of the to-be-recognized terminal is n3; when the to-be-recognized terminal presses any location on the cover plate, the to-be-recognized terminal destroys the total reflection of the light in the cover plate, and
an angle α of the refracted light satisfies: arcsin $$\left(\frac{n2}{n1}\right) \le \alpha < \arcsin\left(\frac{n3}{n1}\right).$$

2. The display module as claimed in claim 1, wherein n3 is greater than n2, and n3 is greater than n1.

3. The display module as claimed in claim 2, wherein the refractive index of the reflection layer is less than the refractive index of the cover plate.

4. The display module as claimed in claim 1, wherein the reflection layer is in a phase of any one of solid, gas, or liquid.

5. The display module as claimed in claim 1, wherein the touch light source is disposed in the edge region, and the touch light source is disposed aligned with the cover plate in the edge region.

6. The display module as claimed in claim 5, wherein a first collimation component is disposed on a side of the touch light source facing toward the cover plate, and the first collimation component is configured to converge the light emitted from the touch light source.

7. The display module as claimed in claim 6, wherein the first collimation component is composed of at least one of a collimation grating or a prism structure.

8. The display module as claimed in claim 7, wherein the prism structure is a convex lens or a concave lens.

9. The display module as claimed in claim 6, wherein when the refractive index of the cover plate is 1.5, a light emission angle of the first collimation component is less than 42 degrees.

10. The display module as claimed in claim 6, wherein a refractive index of a manufacturing material of the first collimation component is greater than 1.6.

11. The display module as claimed in claim 6, wherein in the edge region, a light shielding layer is disposed on a lateral surface of the cover plate facing toward the touch light source, and the first grating is disposed on a lateral surface of the light shielding layer facing away from the cover plate.

12. The display module as claimed in claim 11, wherein the touch light source is a mini light emitting diode (mini-LED) light plate or a micro light emitting diode (micro-LED) light plate.

13. The display module as claimed in claim 12, wherein a width of a light plate of the touch light source is less than or equal to 0.6 millimeter.

14. The display module as claimed in claim 6, wherein a second collimation component is disposed on a side of the recognition component facing toward the cover plate.

15. The display module as claimed in claim 14, wherein the to-be-recognized terminal is a finger, and the recognition component is a fingerprint sensor.

16. The display module as claimed in claim 14, wherein the to-be-recognized terminal is a stylus pen.

17. The display module as claimed in claim 14, wherein the first collimation component is a first prism structure or a second grating, the second collimation component is a second prism structure or a third grating, and the first prism structure, the second prism structure, the second grating, and the third grating are configured to converge light.

18. The display module as claimed in claim 1, wherein the touch light source is an infrared light source.

19. The display module as claimed in claim 18, wherein a manufacturing material of a light shielding layer is black ink which enables infrared light to penetrate.

* * * * *